United States Patent [19]

Honda

[11] Patent Number: 5,378,802
[45] Date of Patent: Jan. 3, 1995

[54] METHOD FOR REMOVING IMPURITIES FROM RESIST COMPONENTS AND NOVOLAK RESINS

[75] Inventor: Kenji Honda, Barrington, R.I.

[73] Assignee: OCG Microelectronic Materials, Inc., West Paterson, N.J.

[21] Appl. No.: 753,526

[22] Filed: Sep. 3, 1991

[51] Int. Cl.$^6$ .............................................. C08F 6/08
[52] U.S. Cl. .................................. 528/480; 528/481; 528/482; 528/492; 528/502; 210/638; 210/660; 210/661; 210/679; 210/681; 210/683; 210/685; 210/686; 210/692
[58] Field of Search ............... 528/480, 481, 482, 492, 528/502; 210/638, 660, 661, 679, 681, 683, 685, 686, 692

[56] References Cited

U.S. PATENT DOCUMENTS

| | | | |
|---|---|---|---|
| 3,067,172 | 12/1962 | Carlstrom | 528/482 |
| 3,509,084 | 4/1970 | Anspon et al. | 528/482 |
| 4,033,909 | 7/1977 | Papa . | |
| 4,070,313 | 1/1978 | Papa | 528/482 |
| 4,563,425 | 1/1986 | Yoshioka et al. | 435/94 |
| 4,693,828 | 9/1987 | Yoshioka et al. | 210/679 |
| 4,700,723 | 10/1987 | Yoshikawa et al. | 131/334 |
| 4,965,167 | 10/1990 | Salamy | 430/191 |

FOREIGN PATENT DOCUMENTS

| | | | |
|---|---|---|---|
| 3217564 | 11/1983 | Germany | C08G 64/46 |
| 50-006587A | 1/1975 | Japan . | |
| 51-118845A | 10/1976 | Japan . | |
| 51-118846A | 10/1976 | Japan . | |
| 52-036161A | 3/1977 | Japan . | |
| 52-120985A | 10/1977 | Japan . | |
| 52-123982A | 10/1977 | Japan . | |
| 52-123986A | 10/1977 | Japan . | |
| 52-128422A | 10/1977 | Japan . | |
| 54-011288A | 1/1979 | Japan . | |
| 54-015019A | 2/1979 | Japan . | |
| 58-19499A | 11/1983 | Japan . | |
| 60-110276A2 | 6/1985 | Japan . | |
| 63-156591 | 6/1988 | Japan . | |
| 2-05046 | 2/1990 | Japan . | |

OTHER PUBLICATIONS

Toray Product Brochure for TIN-100, TIN-200, and TIN-600 1 page only.

T. Yoshioka and M. Shimamura, "Studies of Polystyrene-based Ion Exchange Fiber. I. The Preparation and Fundamental Characteristics of Polystyrene-based Ion Exchange Fiber" Bull. Chem. Soc. Japan, 56, 3776–3729 (1983).

Primary Examiner—John Kight, III
Assistant Examiner—Richard Jones
Attorney, Agent, or Firm—William A. Simons

[57] ABSTRACT

A method of removing ionic impurities from a resist component, comprising the steps of:
 (a) dissolving said resist component in a solvent;
 (b) contacting said resist component solution with a fibrous ion exchange resin for a sufficient amount of time to remove at least a portion of said ionic impurities onto said fibrous ion exchange resin; and
 (c) separating said fibrous ion exchange resin bearing said ionic impurities from said resist component solution.

11 Claims, No Drawings

METHOD FOR REMOVING IMPURITIES FROM RESIST COMPONENTS AND NOVOLAK RESINS

BACKGROUND OF THE INVENTION

1. Field of the Invention

This invention relates to a method for removing impurities from resist components. In particular, this invention relates to a method for removing metal impurities (including sodium, iron, calcium, chromium, copper, potassium, and zinc) from a resist component or resist composition solution by contacting that solution with a fibrous ion exchange resin.

2. Brief Description of Prior Art

Photoresist compositions are used in microlithographic processes for making miniaturized electronic components such as in the fabrication of integrated circuits and printed wiring board circuitry. Generally, in these processes, a thin coating or film of a photoresist composition is first applied to a substrate material, such as silicon wafers used for making integrated circuits or aluminum or copper plates of printed wiring boards. The coated substrate is then baked to evaporate any solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam, and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions-negative-working and positive-working. Both negative-working and positive-working compositions are generally made up of a film-forming resin and a photoactive compound dissolved in a suitable casting solvent. Additives may be added for specific functions. When negative-working photoresist compositions are exposed image-wise to radiation, the areas of the resist composition exposed to the radiation becomes less soluble to a developer solution (e.g., a cross-linking reaction occurs) while the unexposed areas of the photoresist coating remain relatively soluble to a developing solution. Thus, treatment of an exposed negative-working resist with a developer solution causes removal of the nonexposed areas of the resist coating and the creation of a negative image in the photoresist coating; and thereby uncovering a desired portion of the underlying substrate surface on which the photoresist composition was deposited. On the other hand, when positive-working photoresist compositions are exposed image-wise to radiation, those areas of the resist composition exposed to the radiation become more soluble to the developer solution (e.g., a rearrangement reaction occurs) while those areas not exposed remain relatively insoluble to the developer solution. Thus, treatment of an exposed positive-working resist with the developer solution causes removal of the exposed areas of the resist coating and the creation of a positive image in the photoresist coating. Again, a desired portion of the underlying substrate surface is uncovered.

After this development operation, the now partially unprotected substrate may be treated with a substrate etchant solution, plasma gases, or the like. This etchant solution or plasma gases etch the portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining resist layer after the development step and before the etching step to increase its adhesion to the underlying substrate and its resistance to etching solutions.

Positive-working photoresist compositions are currently favored over negative-working resists because the former generally have better resolution capabilities and pattern transfer characteristics. Preferred positive-working photoresist today generally involve novolak resins and o-quinonediazide photoactive compounds dissolved in a suitable solvent.

Impurity levels in photoresist compositions are becoming an increasingly important concern. Impurity contamination, especially by metals, of photoresists may cause deterioration of the semiconductor devices made with said photoresists, thus shortening these devices' lives.

Impurity levels in photoresist compositions have been and are currently controlled by (1) choosing materials for photoresist composition which meet strict impurity level specifications and (2) carefully controlling the photoresist formulation and processing parameters to avoid the introduction of impurities into the photoresist composition. As photoresist applications become more advanced, tighter impurity specifications must be made.

In the case of novolak resin materials used for making positive photoresists, such novolak resins have been subjected to distillation or crystallization purification operations in order to remove impurities, especially metals. However, such operations have deficiencies. One, they are time-consuming and costly. More importantly, they do not remove impurities down to the very low levels now needed for advanced applications (i.e., in low parts per billion maximum levels).

Alternatively, ion exchange resins have been used for novolak impurities. One general technique is to pass an impure novolak resin solution through a particulate cation exchange resin (e.g., AMBERLYST styrene sulfonic acid-divinyl benzene cation exchange resin). However, such treatments have several problems associated with it including the following:

1. The cation exchange resin treatment of the novolak may decrease the pH of the novolak-containing solution, possibly causing serious corrosion of metal containers in which the purified novolak-containing solution may be stored.

2. The purified novolak may have a decreased rate of dissolution during the development step of the photoresist which may be caused by the undesired adsorption of the lower molecular weight portion of novolak resin onto the cation exchange resin.

3. Alkali metals such as sodium and potassium are easily removed with conventional particulate cation exchange resins. However, divalent or trivalent metal cations (e.g., $Cu^{+2}$, $Ni^{+2}$, $Zn^{+2}$, $Fe^{+2}$, $Fe^{+3}$, $Ca^{+2}$ or $Cr^{+3}$ ions) may have a lower affinity to conventional cation exchange resins. Iron and other easily oxidizable metals cannot be completely removed because they may be colloidal metal hydroxides or oxides. Such colloidals are not significantly removed by cation exchange resin treatment.

In addition to the standard cation exchange resin treatment of the novolak resin, it is known to subject complete photoresist compositions (e.g., novolak resin, photosensitizer, and solvent) to cation exchange resin treatment. For example, Japanese Patent Publication (Kokai) No. 01-228,560, which was published on Sep. 12, 1989, teaches that the metal impurities content in photosensitive resin solutions or photoresist compositions may be reduced with a mixture of a cation and anion exchange resins. However, this technique has the deficiency of not removing divalent and trivalent metal impurities.

In addition to the above-described problems, it is difficult to separate the particulate ion exchange resins by filtration from a viscous solution of a resist component on a whole resist formulation after the ion exchange treatment, especially when the relative amount of particulate ion exchange resin to resist component is high. In particular, when a particulate ion exchange resin is used, those resin particulates can become stuck in the microporous filter openings, thus significantly decreasing the filtering time.

Separately, fibrous ion exchange resins have been used to purify liquids such as water. U.S. Pat. No. 4,693,828 disclose a series of ion exchange fibers which are made of a polystyrene/polyolefin composite. Those patents also disclosed applications of those ion exchange fibers in the purification of water and chemicals. However, the patents do not teach or suggest purification of resist components with ion exchange fibers.

Accordingly, there is still a need in the photoresist art for improved methods of removing impurities from novolak resins and other materials used as photoresist components. The present invention is a solution to that need.

BRIEF SUMMARY OF THE INVENTION

Therefore, one embodiment of the present invention is directed to a method of removing ionic impurities (e.g., either cationic or anionic) from a resist component comprising the steps of:
(a) dissolving said resist component in a solvent;
(b) contacting said resist component solution with a fibrous ion exchange resin for a sufficient amount of time to remove (or transfer or sorption) at least a portion of said impurities onto said fibrous ion exchange resin; and
(c) separating said ion exchange resin bearing said metal impurities from said resist component solution.

A specific embodiment of the present invention is directed to a method of removing metal impurities from a resist component, comprising the steps of:
(a) dissolving said resist component in a solvent;
(b) contacting said resist component solution with a fibrous cation exchange resin and, optionally either an anion exchange resin or a chelate exchange resin, for a sufficient amount of time to remove at least a portion of said metal impurities onto said fibrous cation exchange resin and, optionally, onto either said anion exchange resin or said chelate resin; wherein said fibrous cation exchange resin optionally having been prewashed with quaternary ammonium salt solution; and
(c) separating said fibrous cation exchange resin bearing said metal impurities from said resist component solution.

DETAILED DESCRIPTION

The term "resist component" as used in the present specification and claims includes alkali-soluble resins such as novolak resins and polyvinyl phenol resins, photoactive compounds as well as their precursors, and additives (e.g., speed enhancers, dyes, and the like) conventionally employed in photoresist compositions. This term also includes precursor compounds for making such components. Examples of such precursor compounds would be backbone compounds for making photoactive compounds as well as the precursor photoactive ester compounds (e.g., naphthoquinone diazide sulfonyl chlorides).

The term "novolak resin" as used herein refers to any novolak resin which will dissolve completely in an alkaline developing solution conventionally used with positive-working photoresist composition. Suitable novolak resins include phenol-formaldehyde novolak resins, cresol-formaldehyde novolak resins, xylenol-formaldehyde novolak resins, cresol-xylenol-formaldehyde novolak resins, preferably having a molecular weight of about 500 to about 40,000, and more preferably from about 800 to 20,000. These novolak resins are preferably prepared by the addition-condensation polymerization of a phenolic monomer or monomers (e.g., phenol, cresols, xylenols, or mixtures of such monomers) with an aldehyde source such as formaldehyde and are characterized by being light-stable, water-insoluble, alkali-soluble, and film-forming. One preferred class of novolak resins is formed by the addition-condensation polymerization between a mixture of meta- and para-cresols with formaldehyde having a molecular weight of about 1,000 to about 10,000. Illustrative preparations of novolak resins are disclosed in U.S. Pat. Nos. 4,377,631; 4,529,682; and 4,587,196, all of which issued to Medhat Toukhy and are incorporated herein by reference in their entireties.

Other preferred novolak resins are illustrated in U.S. Pat. No. 5,322,757 and U.S. Pat. No. 5,237,037 Their disclosures are also incorporated herein by reference in their entireties.

The term "photoactive compounds" as employed in the present specification and claims may include any conventional photoactive compound commonly used in photoresist compositions. Quinonediazide compounds are one preferred class of photoactive compounds. Naphthaquinone diazide compounds are preferred class of species in that generic class. As mentioned above, photoactive compound precursors may be treated according to the present invention. One photoactive compound precursor which has been treated according to this method is 2,6-bis(2,3,4-trihydroxyphenyl)methylene-4-methyl phenol(also known as 7-PyOL) which is described in Example 3 of U.S. Pat. No. 4,992,356.

Photoresist additives may be treated according to the present invention. Such additives may include speed enhancers, dyes, and the like. One preferred speed enhancer is 1-[(1'-methyl-1'-(4'-hydroxyphenyl)ethyl)]4-[1',1'-bis-(4-hydroxyphenyl)ethyl]benzene (also known as TRISP-PA).

In the first step of the present process, the resist component is dissolved in a solvent or solvent mixture to facilitate the contacting of the resist component with the fibrous ion exchange resin. Examples of suitable solvents include acetone, methoxyacetoxy propane, ethyl cellosolve acetate, n-butyl acetate, ethyl lactate, ethyl-3-ethoxy propionate, propylene glycol, alkyl ether acetate, or mixtures thereof and the like. Cosolvents such as xylene or n-butyl-acetate may also be used. One preferred solvent is a mixture of ethyl lactate and ethyl-3-ethoxy propionate wherein the weight ratio of ethyl lactate to ethyl-3-ethoxy propionate is from about 30:70 to about 80:20.

The solids contents of the resultant resist component solution is not critical. Preferably, the amount of solvent or solvents may be from about 50% to about 500%, or higher, by weight; more preferably from about 75% to about 400% by weight; based on the resist component weight.

While it is preferred to use a single resist component as the material being treated by the method of the present process, it is contemplated within the scope of the present invention that combinations of resist components may be treated. For example, it may be desirable to treat a complete positive-working photoresist formulation (e.g., a combination of a novolak resin or resins, a photoactive compound such as quinonediazide sensitizer, and solvent or solvents as well as conventional optional minor ingredients such as dyes, speed enhancers, surfactants, and the like) according to the method of the present invention.

The impurities in the resist component solution may be in the form of monovalent metal cations such as alkali metals (e.g., $Na^+$ and $K^+$) as well as divalent or trivalent cations (e.g., $Ca^{+2}$, $Fe^{+2}$, $Fe^{+3}$, $Cr^{+3}$, or $Zn^{+2}$). Such metal impurities may also be in the form of collidal particles such as insoluble colloidal iron hydroxides and oxides. Such metal impurities may come from the chemical precursors for the resist component (e.g., for novolak resins these may be phenolic monomers and aldehyde sources) as well as in the solvent used to make the solution. These impurities may also come from the catalysts used to make the resist components or from the equipment used for their synthesis or storage. Generally, the amount of metal impurities in a resist component such as a novolak resin prior to the present inventive process is the range from 500 ppb–5,000 ppb, or greater, by weight for metals such as sodium and iron. Sodium impurities are generally in the form of monovalent ions ($Na^+$). The iron impurities are in the form of divalent and trivalent species ($Fe^{+2}$ and $Fe^{+3}$) as well as insoluble colloidal iron species (e.g., iron hydroxides and oxides). The resist component impurities may also include anionic impurities such as halides (e.g., $Ci^-$, $F^-$, $Br^-$).

The resist component solutions may be made in any conventional method of mixing a resist component with a solvent. Generally, it is preferred that the resist component is added to a sufficient amount of solvent so that the resist component is dissolved in the solvent. This step may be facilitated by agitation or other conventional mixing means.

The next step in the process of the present invention is contacting the resist component solution with fibrous ion exchange resin. The fibrous ion exchange resin may be a cation exchange resin or an anion exchange resins or a combination thereof. The term "fibrous" is used in the present specification and claims to describe ion exchange resins, particularly cation and anion exchange resins made up of fibrous material, as opposed to particulate material. Such fibrous material may be in the shape of fibers, sheets, strings, fine fibers, and fine films.

The fibrous ion exchange resin may be made of two components, one of which is an ion exchange group-bearing polymer and the other a fiber-forming polymer for reinforcement. Two component polymers are made in suitable forms, for example, by spinning. Ion exchange groups are introduced into at least one of the two component polymers after cross-linking for reinforcement. Polystyrene, phenol-formaldehyde resin, polyester, polyamide, polyvinylalcohol, or polyacrylate may be used as one of the component polymers to which an ion exchange group is introduced, where the introduced ion exchange group may include cation exchange groups such as sulfonic acid, phosphoric acid, carboxylic acid and iminodiacetic acid, or anion exchange groups such as quaternary ammonium cations or chelating groups such as aminocarboxylic acid, amidoxime, primary amines, secondary amines, tertiary amines, pyridine, and imidazole. Polypropylene, polyethylene, other polyolefins, polyacrlonitrile, or cellulose acetate may be used as the other component polymer.

Generally, the fibrous ion exchange resins are made of fibers which are about 0.1–100 mm, preferably 0.5–10 mm, in length; and about 1–1000 mircons, preferably 10–100 mircons, in diameter. Preferred fibrous cation exchange resins are TIN-100 and TIN-600, available from Toray Industries Inc. of Tokyo, Japan. TIN-100 is a polystyrene/polyolefin composite fiber having sulfonic acid groups introduced onto the polystyrene resin. TIN-600 is a polystyrene/polyolefin resin having iminodiacetic acid groups introduced onto the polystyrene. Both TIN-100 and TIN-600 have a fiber diameter of 40 microns and a fiber length of 0.5 mm. A preferred fibrous anion exchange resin is TIN-200 also available from Toray Industries Inc. It is a polystyrene/polyolefin composite resin having trimethylbenzylammonium groups introduced on the polystyrene. It also has a fiber diameter of 40 microns and fiber length of 0.5 mm. These fibrous ion exchange resins have excellent absorptive powers and large surface area as well as having good chemical and heat resistance.

AS stated above, a preferred embodiment of the present invention is the pretreatment or prewashing of the fibrous ion exchange resin, especially fibrous cation exchange resin, with a quaternary ammonium salt solution.

It is also believed that the anions in quaternary ammonium salt compounds, particularly hydroxides, can extract the cationic counter ion (e.g., $H^+$ or $Na^+$ so that the bulky quaternary ammonium cation thus becomes the counter ion on the cation exchange resin. This replacement of the $H^+$ or $Na^+$) cation counter ion with the bulky quaternary ammonium cation counter ion results in a higher efficiency of metal ion reduction and retards the hydrolysis of resist components or solvents containing said resist components.

Quaternary ammonium salt compound may include tetramethylammonium hydroxide (TMAH), although it is believed other tetra-alkyl ammonium hydroxides as well as other classes of quaternary ammonium salts would be suitable for the present process.

Other monomeric quaternary ammonium cations may include tetraethylammonium, methyltriethanolammonium, dimethyldiethanolammonium, trimethylethanolammonium, benzylmethyldiethanolammonium.

The most preferred quaternary ammonium salt compounds are polymeric quaternary ammonium compounds. These may include hexamethrine, poly(vinylbenzyltrimethylammonium) chloride, polyimidazoline, and quaternized poly(vinylpyridine).

Polymeric quaternary ammonium compounds are preferred because of the stronger immobilization of a polymeric quaternary ammonium cation to an anionic group of cation exchange resin as compared to a monomeric quaternary ammonium cation.

The quaternary ammonium salt is contacted to the ion exchange resin in the form of a solution, most preferably, an aqueous solution. The amount of ammonium salt in solution is generally from about 1% to about 50% by weight of the solution.

The amount of quaternary ammonium salt compound employed should be in excess to the weight of the cation exchange resin being treated. Generally, the amounts of quaternary ammonium salt employed is from about 150% to 1,000% or higher, by weight of cation exchange resin.

The mode of prewashing may be any method conventionally used to wash cation exchange resins with water or organic solvents. One preferred method is to add the resins to a large weight excess of an aqueous solution containing 2–30% by weight quaternary ammonium salt and stirring the resulting suspension for 20–40 minutes at room temperature, followed by decanting the quaternary ammonium salt solution. This stirring and decanting may be repeated 3–5 times. Thus, the washed resins may be further washed with the same solvent solution which will be used in contacting (b) step in order to preswell the fibrous cation exchange resins.

The contacting of the resist component solution with the fibrous cation exchange resin and fibrous anion exchange resin may be a simultaneous or sequential operation. If simultaneous, the contacting with the anion resin and cation exchange resin will occur at the same time. If sequential, the resist component will be contacted first with either the anion exchange resin or cation exchange resin and then contacted with the other resin. Preferably, the cation exchange resin treatment is followed by the anion exchange resin treatment. In any case, the amount of time for each contacting should be sufficient to adsorb at least a portion (preferably, at least a major portion (at least 50%) by weight and, more preferably, at least 90% by weight) of the total impurities present in the resist component solution.

There are four preferred modes of this contacting step for the present invention. They are as follows:

1. Mixed Bed Column System—The fibrous anion exchange resin and fibrous cation exchange resin are packed together in an ion exchange column and the resist component solution is passed through the column. Preferably, the resist component solution is passed at a constant rate and constant temperature to maximize sorption of the metal impurities onto the anion and cation exchange resins.
2. Mixed Batch System—The anion enchange resin and cation exchange resin are mixed into the resist component solution to provide a resultant suspension. After a sufficient contacting time has passed, the anion and cation exchange resins are removed, preferably by filtration, from the resist component solution. Preferably, it may be advantageous in some situation to disperse the anion exchange resin and cation exchange resin in a solvent before adding to the resist component solution. Further, it may be preferable to carry out the contacting in this mode at a constant temperature to maximize sorption onto the anion and cation exchange resins.
3. Sequential Column System—The anion exchange resin is packed into one ion exchange column and the cation exchange resin is packed into a separate ion exchange column. The resist component solution is then passed through both columns in a sequential manner.
4. Sequential Batch System—In this mode, the resist component solution is mixed with either the anion exchange resin or cation exchange ion resin in a closed container and after a suitable contacting time, the anion or cation exchange resin is separated, preferably by membrane filtration, from the resist component solution. Next, the partially treated resist component solution is contacted with the resin not used in the first system, and then that resin is separated from the resist component system.

The separation step (c) of the present invention necessarily occurs immediately after the contacting step (b) when the mixed bed column system or sequential column system is used. With the mixed batch system and sequential batch system, the separation step (c) requires an additional step by the operator.

After the contacting and separation steps, the thus treated resist component system has a reduced impurity content of less than about 100 parts per billion (ppb) by weight for each impurity. For example, the amount by weight of sodium impurities may range from only 100 ppb to 20 ppb or even lower.

If the untreated resist component solution contains a significant amount of insoluble colloidal hydroxides or oxides, the resist component solution may be passed through a micro-pore membrane having a pore size of 0.1–0.5 microns prior to the contacting with the cation exchange resin and optionally with a chelate resin. This filtration operation will remove at least a portion of the insoluble colloids and thus make the contacting step (b) more efficient.

Basically, lithographic performance of photoresist is deteriorated by any type of ion exchange resin treatment. However, if a fibrous exchange resin is used for the treatment instead of conventional particulate ion exchange resin, the lithographic deterioration can be minimized. In addition, time required for this treatment may be shortened with fibrous ion exchange resins due to a larger surface area and special form of the fibrous resin.

The following Example and Comparison are given to further illustrate the present invention. All parts and percentages are by weight unless explicitly stated otherwise.

EXAMPLE 1

A mixed meta-/para-cresol novolak resin was made by reacting formaldehyde with a cresol mixture which was 40% m-cresol/60% p-cresol by moles in the feed. The molecular weight of the novolak resin was 6,500 as measured by GPC. This novolak (63 grams) was dissolved in a mixed solvent of ethyl lactate (EL) (96 grams) and ethyl-3-ethoxypropionate (EEP) (41 grams). This novolak solution (200 grams) was placed in a plastic bottle. A particulate chelate resin[1] (8.0 grams) and a fibrous cation exchange[2] (8.0 grams) were then added to the bottle. Both the chelate resin and cation exchange resin were washed with the same mixed solvent, mentioned above, three times before use.

(1) DIANION CR-20 produced by Mitsubishi Kasei of Tokyo, Japan. This particulate chelate resin is a cross-linked styrene-divinyl benzene copolymer bead having polyamine functional chelating groups and which has an average 1.2 micron particle diameter.
(2) TIN-100, produced at Toray Industries Inc., Tokyo, Japan. This is a polystyrene/polyolefin composite fiber having sulfonic acid groups introduced on the polystyrene moiety.

The resultant suspension was rolled in a bottle roller for 24 hours. The particulate chelate and fibrous cation exchange resin particles were then removed from the suspension by filtering the suspension through a membrane filter having 0.2 micron pore size.

The various metal impurity contents in the novolak solution were measured before the addition of the particulate chelate and fibrous cation exchange resins and after their removal by filtration. These metal contents were determined by graphite furnace atomic absorption spectrometry. The results of these measurements are shown in Table 1 below.

COMPARISON 1

The same novolak, EL, and EEP solution (200 grams) prepared for Example 1 was placed in a plastic bottle. The same prewashed chelate resin (8.0 grams) used in Example 1 was added to that novolak solution. A particulate cation exchange resin[3] (8.0 grams) was also added to the novolak solution.
(3) RCP-22H produced by Mitsubishi Kasei of Tokyo, Japan. This cation exchange resin is styrene sulfonic acid-divinyl benzene copolymer which is a highly porous cross-linked particulate resin.

The resultant suspension was rolled by a bottle roller for 24 hours at room temperature. The chelate and cation exchange resin particles were removed from the suspension by filtering the suspension through a membrane filter having 0.2 micron pore size.

The particulate chelate resin and particulate cation exchange resin were both prewashed with the same mixed solvent in the same manner as described in Example 1.

Various metal impurity contents of the novolak solution were measured before and after their filtration by the same analytical techniques described in Example 1. The results of these measurements are given in Table below.

TABLE 1

| Treatment | NA | K | CA | Fe | Zn | Cu | Cr | Separation Times* |
|---|---|---|---|---|---|---|---|---|
| Before | 56 | 36 | 73 | 33 | 120 | 15 | 10 | 1.0 |
| After Example 1 | 32 | 34 | <20 | <20 | 63 | 8 | 8 | 1.1 |
| After Comparison 1 | 48 | 33 | 70 | 31 | 62 | 11 | 11 | 2.5 |

*The time required to filter a certain amount of the novolak solution to remove a fixed amount of the ion exchange resins by 0.2 micron pore size of membrane filter, which was normalized to the filtration time of the same novolak solution without the resins.

From the data in Table 1, it can be seen that the fibrous ion exchange resin used in Example 1 had a higher efficiency of the metal reduction from the novolak than a particulate ion exchange resin used in Comparison 1.

Also, the fibrous ion exchange resin used in Example 1 had a higher efficiency of separation from the novolak after the use in terms of time consumption compared with a particulate ion exchange resin used in Comparison 1.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A method of removing metal impurities from a novolak resin, comprising the steps of:
   (a) dissolving said novolak resin in a solvent;
   (b) contacting said novolak resin solution with at least one fibrous cation exchange resin for sufficient amount of time to transfer at least a major portion of said metal impurities onto said fibrous cation exchange resin, wherein said cation exchange resin is prewashed with a solution of a quaternary ammonium salt compound; and
   (c) separating said cation exchange resin bearing said metal impurities from said novolak resin solution.

2. The method of claim 1 wherein said contacting is carried out by adding said fibrous cation exchange resin to said novolak resin solution.

3. The method of claim 1 wherein said contacting and separating steps are carried out by passing said novolak resin solution through at least one ion exchange column or bed comprising said fibrous cation exchange resin.

4. The method of claim 1 wherein said quaternary ammonium salt compound is a polymeric ammonium salt compound.

5. The method of claim 1 wherein said solvent comprises ethyl lactate or mixtures thereof with ethyl-3-ethoxypropionate.

6. A method of removing metal impurities from a resist component comprising the steps of:
   (a) dissolving said resist component in a solvent;
   (b) washing a fibrous cation exchange resin with a quaternary ammonium salt compound solution;
   (c) contacting said prewashed fibrous cation exchange resin with said resist component solution for a sufficient amount of time to remove at least a portion of said metal impurities onto said fibrous cation exchange resin; and
   (d) separating said cation exchange resin bearing said metal impurities from said resist component solution.

7. The method of claim 6 wherein said quaternary ammonium salt compound is a polymeric ammonium salt compound.

8. The method of claim 6 wherein the mode of contacting comprises adding said fibrous cation exchange resin to said resist component solution.

9. The method of claim 6 wherein said contacting and separating steps comprise passing said resist component solution through at least one ion exchange column or bed containing said fibrous cation exchange resin.

10. The method of claim 8 wherein said separating step is filtration.

11. The method of claim 6 wherein said solvent comprises ethyl lactate or mixtures thereof with ethyl-3-ethoxy propionate.

* * * * *